(12) United States Patent
Davis, Jr. et al.

(10) Patent No.: US 7,696,594 B2
(45) Date of Patent: Apr. 13, 2010

(54) ATTACHMENT OF A QFN TO A PCB

(75) Inventors: Willie T. Davis, Jr., Raleigh, NC (US);
Todd D. Fellows, Raleigh, NC (US);
Larry D. Gross, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 11/315,613

(22) Filed: Dec. 22, 2005

(65) Prior Publication Data

US 2007/0148816 A1     Jun. 28, 2007

(51) Int. Cl.
*H01L 29/78* (2006.01)
(52) U.S. Cl. .............................. 257/459; 257/E23.015; 438/612
(58) Field of Classification Search ................. 257/786, 257/459, 678, 414, 428, 431, 449, 99, 687, 257/716, 773, 787, E23.015, E23.02, E23.037; 438/612, 106, 108, 119
See application file for complete search history.

(56) References Cited

U.S. PATENT DOCUMENTS

| | | | | |
|---|---|---|---|---|
| 4,567,542 A | * | 1/1986 | Shimada et al. | 361/321.4 |
| 5,001,605 A | * | 3/1991 | Savagian et al. | 361/792 |
| 5,764,488 A | * | 6/1998 | Silva et al. | 361/777 |
| 5,834,848 A | * | 11/1998 | Iwasaki | 257/778 |
| 5,920,462 A | * | 7/1999 | Glovatsky et al. | 361/760 |
| 6,545,229 B1 | | 4/2003 | Ma et al. | |
| 7,361,997 B2 | * | 4/2008 | Yashiro | 257/786 |
| 2002/0185304 A1 | | 12/2002 | Sakai et al. | |
| 2003/0235043 A1 | | 12/2003 | Yoshida | |

FOREIGN PATENT DOCUMENTS

JP        2003051669 A       2/2003
WO     WO 03/092345 A1    11/2003

OTHER PUBLICATIONS

"Application Notes for Surface Mount Assembly of Amkor's MicroLeadFrame (MLF) Package" Dec. 2003.*

* cited by examiner

*Primary Examiner*—W. David Coleman
*Assistant Examiner*—Su C Kim
(74) *Attorney, Agent, or Firm*—Steven L. Bennett; Schubert Osterrieder & Nickelson PLLC

(57) ABSTRACT

Methods and arrangements to attach a QFN to a PCB, systems which include a QFN attached to a PCB, and apparatuses for controlling the deposit of solder upon a PCB are disclosed. Embodiments include transformations, code, state machines or other logic to calculate a total area for the QFN IO pads. Embodiments may then determine a total area for the regions of solder applied to the PCB thermal pad to which the QFN thermal pad may be connected in dependence upon the calculated total area for the QFN IO pads. In some embodiments, the total area of the solder regions applied to the PCB thermal pad is approximately equal to the calculated total area for the QFN IO pads. In many embodiments, the number of regions of solder and the shape of the regions of solder is determined.

15 Claims, 7 Drawing Sheets

ATTACHMENT OF A QFN TO A PCB

FIELD

The present invention is in the field of printed circuit board assembly. More particularly, the present invention relates to methods and arrangements to attach a QFN to a PCB and to systems which include a QFN attached to a PCB.

BACKGROUND

The attachment of components to printed circuit boards (PCBs) produces printed circuit board assemblies (PCBAs), which can be used as motherboards in computers such as blades and servers, in mid-planes, as cards such as graphics cards, and for other purposes. A PCB is a laminated board made of an insulating material such as plastic which contains several layers of metal such as copper separated by insulating material. The metal may function to establish electrical connections between parts mounted on the board, conduct heat, or provide a ground.

One increasingly popular component of PCBAs is a quad flat pack no-lead (QFN) chip. QFNs can also be called MicroLead Frames (MLF). A QFN is an electronic component encapsulated in plastic or some other insulating material. A QFN contains a row of IO pads, areas in which bare metal is exposed, on each of its four sides (hence, the "quad" in QFN) for electrical connectivity with the PCB. The QFN also typically contains a thermal pad underneath, an exposed area of metal for conducting heat away from the package. A QFN may be light, present a small footprint, and feature good thermal and electrical conductivity. The small footprint conserves space on the PCB, which can be scarce.

Good thermal conductivity helps to maintain the QFN and the point of connection at an acceptable temperature, thus preserving the useful life and reliability of the chip. A QFN can be attached to a PCB by soldering it directly to a PCB. QFNs may prove more difficult to attach to PCBs than components with leads. Those components may be attached to a PCB by soldering the lead to the PCB. Soldering together two flat planes, the QFN thermal pad and the PCB, may be more difficult than soldering a lead from a leaded component to the PCB. To solder the QFN to the PCB, solder paste, which may contain solder and flux chemicals, can be applied to the surface of the PCB at appropriate regions. The solder paste can be applied to the PCB surface by extrusion through a stencil. The solder paste can be placed on the stencil and forced through the apertures of the stencil by pressing with a squeegee. After the application of solder paste, the QFN can be positioned on the PCB, and the assembly placed into an oven or series of ovens and heated. The heating can evaporate the flux chemicals and other solvents and cause the solder to melt, leading to wetting and wicking. A solder mask can also be placed on the PCB to control the solder paste during heating. The solder mask defines openings on the outer layers of the PCB and exposes the copper features of the PCB. The solder mask helps to prevent the liquid solder from flowing away from the desired areas of solder application. The solder mask is placed over the PCB, and solder paste is applied to areas of the PCB to which the QFN is to be attached that are not protected with a solder mask.

To prepare for attachment of a QFN, the area of the PCB on which the QFN will rest may be fitted with IO pads and a thermal pad, regions for contact with the QFN IO pads and QFN thermal pad. The pads may consist of copper or another metal. When the QFN is attached to the PCB, the QFN pads rest on the corresponding PCB pads and are connected with solder. The PCB pads may be slightly larger than the QFN pads to provide tolerance for imperfect placement. The QFN IO pads may be soldered to the PCB IO pads to provide an electrical connection between the PCB and the QFN. The thermal pad of the QFN may be soldered to the PCB thermal pad to provide thermal conductivity and a mechanical connection and can also provide an electrical connection. The direct soldering of bare metal areas of the QFN to the surface of the PCB may provide for good electrical and thermal conductivity as well as a good mechanical connection. To conduct away heat transferred from the QFN thermal pad to the PCB thermal pad, the PCB thermal pad region may contain vias. Vias are conduits which may connect the PCB thermal pad to metal layers in the interior of the PCB and on the opposite surface of the PCB. The vias may consist of metal-plated tunnels through the PCB. The vias may be connected to the QFN only indirectly. Instead of a direct connection, the thermal pad of the QFN may be soldered to the PCB thermal pad, and the PCB thermal pad may be connected to the vias.

Generally, solder does not cover the entire PCB thermal pad. Instead, smaller regions of solder, called solder pads, can be deposited on the PCB thermal pad. The amount of coverage may be expressed as a percentage. For example, 50% coverage indicates that half the area of the thermal pad is covered with solder. Solder is not placed on the vias. The solder can damage the vias. The amount of solder placed on the PCB thermal pad is critical to the attachment process. When too much solder is placed on the PCB thermal pad, the QFN may actually float on top of the solder. The heating process may create a ball of solder in the middle of the QFN on which the QFN floats. The QFN may begin to turn, depending on how the QFN was placed on the PCB and on other factors such as air movement and vibration. The movement of the QFN may create shorts in the QFN IO pads. Movement of the QFN IO pads may cause solder to smear from one QFN IO pad to another. Further, the floating of the QFN on the excess solder in the thermal pad region can interfere with the forming of solder joints in the IO pad regions. On the other hand, too little solder can cause a poor or non-existent connection between the QFN and the PCB.

In addition to the total amount of solder, the size of the individual solder pads affects the attachment process. A solder pad with minimum diameter smaller than the width of a stencil through which the solder pad is extruded may not deposit out of the stencil in the proper shape. Regions of solder with minimum dimension equal to 1.5 times the width of the stencil may provide for the more reliable deposit of solder in the shape of the holes in the stencil. Solder pads that are too large may create voiding. Gas may be trapped underneath a large pad, preventing the connection between the solder and the QFN. Voiding is much less a problem with smaller sizes of solder pads. The gases can escape to the sides of the solder pads.

The guidance offered by QFN manufacturers is often not helpful. The advice may be contradictory. It may call for the placement of a large number of vias on the thermal pad and a percentage coverage of the thermal pad with solder that is impossible to achieve given the number of vias. The advice may call for excess amounts of solder. Attempting to follow the manufacturers' recommendations for the amount of solder has led to large rejection rates of PCBAs, leading to the expense and time of reworking the PCBAs.

SUMMARY OF THE INVENTION

The problems identified above are in large part addressed by methods and arrangements to attach a QFN to a PCB, by systems which include a QFN attached to a PCB, and by apparatuses for controlling the deposit of solder onto a thermal pad of a PCB for the attachment of a QFN to the PCB. One embodiment provides a method to attach a QFN to a PCB. The method may involve receiving a specification of the geometry of the IO pads of the QFN and calculating a total area of the IO pads of the QFN dependent upon the specification of the geometry of the IO pads of the QFN. Furthermore, the method may involve determining a total area for a deposit of solder upon a thermal pad of the PCB, the total area for the deposit of solder dependent upon the total area of the IO pads of the QFN.

Another embodiment provides a system which includes a QFN attached to a PCB. The system may include a PCBA which includes a PCB, a QFN, and regions of solder connecting the PCB and QFN. Both the PCB and the QFN may include IO pads and a thermal pad. The QFN thermal pad may be soldered to the PCB thermal pad and the QFN IO pads may be soldered to the PCB IO pads. A total area of the regions of solder coupling the thermal pad of the QFN and the thermal pad of the PCB (thermal pad solder regions) may be between 50% and 120% of a total area of the IO pads for the PCB and a total area of the regions of solder for the thermal pad may be less than 50% of an area of the PCB thermal pad.

Another embodiment provides an apparatus for controlling the deposit of solder onto a thermal pad of a PCB for the attachment of a QFN. The apparatus may provide a barrier to the deposit of solder on a portion of the solder pad. In addition, the apparatus may enable the deposit of regions of solder onto the thermal pad with a total area between 50% and 120% of the total area of the IO pads of the QFN, and with a total area of the regions of solder less than 50% of the area of the thermal pad of the PCB.

BRIEF DESCRIPTION OF THE DRAWINGS

Advantages of the invention will become apparent upon reading the following detailed description and upon reference to the accompanying drawings in which like references may indicate similar elements.

DETAILED DESCRIPTION OF EMBODIMENTS

The following is a detailed description of embodiments of the invention depicted in the accompanying drawings. The embodiments are in such detail as to clearly communicate the invention. However, the amount of detail offered is not intended to limit the anticipated variations of embodiments; but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, methods and arrangements to attach a QFN to a PCB, systems which include a QFN attached to a PCB, and apparatuses for controlling the deposit of solder upon a PCB are contemplated. Embodiments include transformations, code, state machines or other logic to calculate a total area for the QFN IO pads. Embodiments may then determine a total area for the regions of solder applied to the PCB thermal pad to which the QFN thermal pad is connected in dependence upon the calculated total area for the QFN IO pads. In some embodiments, the total area of the solder regions applied to the PCB thermal pad is approximately equal to the calculated total area for the QFN IO pads. In many embodiments, the number of regions of solder and the shape of the regions of solder is determined.

While specific embodiments will be described below with reference to particular circuit or logic configurations, those of skill in the art will realize that embodiments of the present invention may advantageously be implemented with other substantially equivalent configurations.

Figure 1:
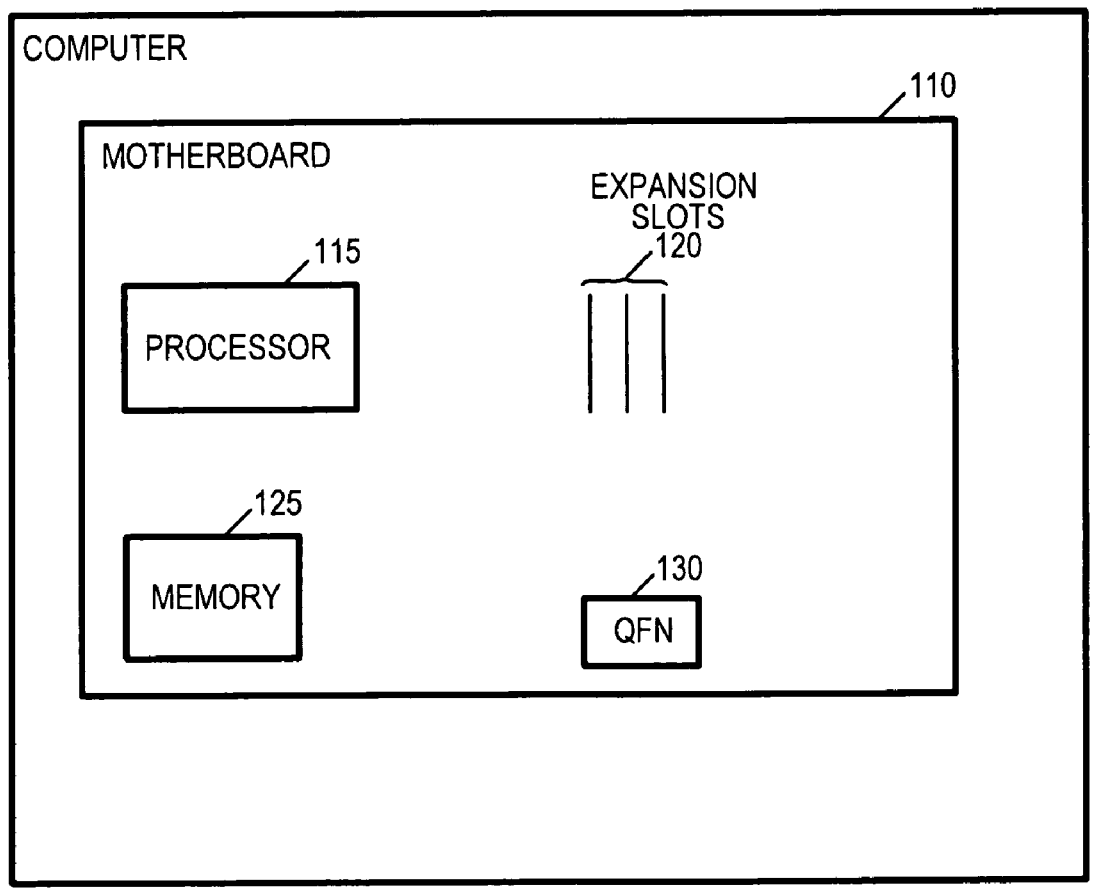
FIG. 1 depicts a computer containing a QFN attached to a PCB.

Turning now to the drawings, FIG. 1 depicts an embodiment of a computer 100 containing a motherboard 110 to which a processor 115, memory 125, and a quad flat pack no-lead chip (QFN) 130 are attached according to embodiments of the present invention. The motherboard 110 also contains expansion slots 120. The motherboard 110 is a printed circuit board assembly (PCBA), which is a printed circuit board (PCB) to which components are attached. A PCB is a laminated board made of an insulating material such as plastic which contains several layers of metal such as copper separated by insulating material. The metal may function to establish electrical connections between parts mounted on the board, conduct heat, or provide a ground or power. A number of components are affixed to the motherboard 110, including a QFN 130. The QFN 130 contains a row of IO pads on each of its four sides (hence, the "quad" in QFN) for electrical connectivity with a PCB. The QFN 130 contains a thermal pad underneath, which is soldered to a thermal pad of the motherboard 110 to provide thermal conductivity and a mechanical connection and perhaps a ground or power connection. The computer 100 can represent a blade, a server, a laptop, or the like. In the embodiment of FIG. 1, a total area of the deposit of solder used to attach the thermal pad of the QFN to the motherboard 110 is determined in dependence upon a determination of a total area for the IO pads of the QFN 130.

Figure 2:
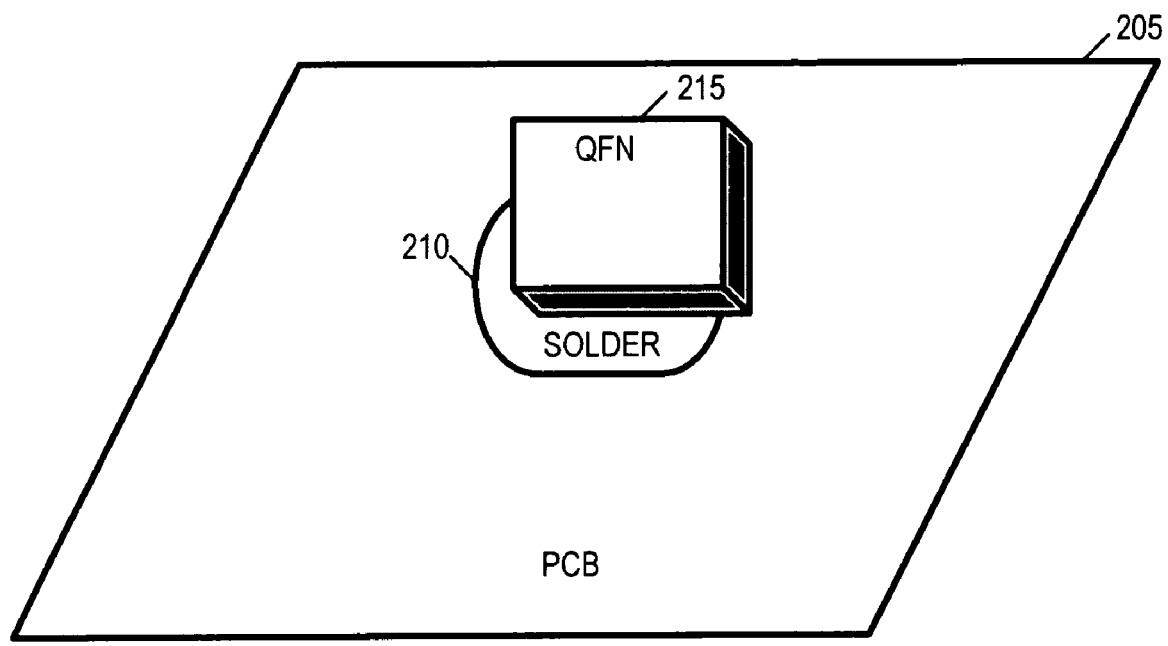
FIG. 2 depicts a cross-sectional view of an embodiment of a system which includes a QFN attached to a region of a PCB with solder.

FIG. 2 depicts a cross-sectional view of an embodiment 200 of a portion of a PCBA consisting of a QFN 215 attached to a portion of a PCB 205 with solder 210. The QFN 215 is soldered directly to a portion of the PCB 205. In the embodiment of FIG. 2, the QFN 215 contains a thermal pad, the portion of a PCB 205 contains a thermal pad, and the thermal pad of the QFN 215 is soldered to the thermal pad of the PCB 205. In some embodiments, a PCB with QFN attached can make up a card such as a motherboard, a graphics card, a sound card, a network card, and the like. In still other embodiments, a PCB with QFN attached can form a component of a mid-plane or other device. In the embodiment of FIG. 2, the area of solder used to connect the thermal pad of the QFN 215 to the thermal pad of the portion of a PCB 205 is determined by receiving a specification of the geometry of the IO pads of the QFN 215, determining a total area for the IO pads of the QFN 215 based upon the specification, and determining a total area for a deposit of solder upon the thermal pad of the portion of a PCB 205, with the total area for the deposit of solder dependent upon the total area of the IO pads of the QFN 215.

Figure 3:
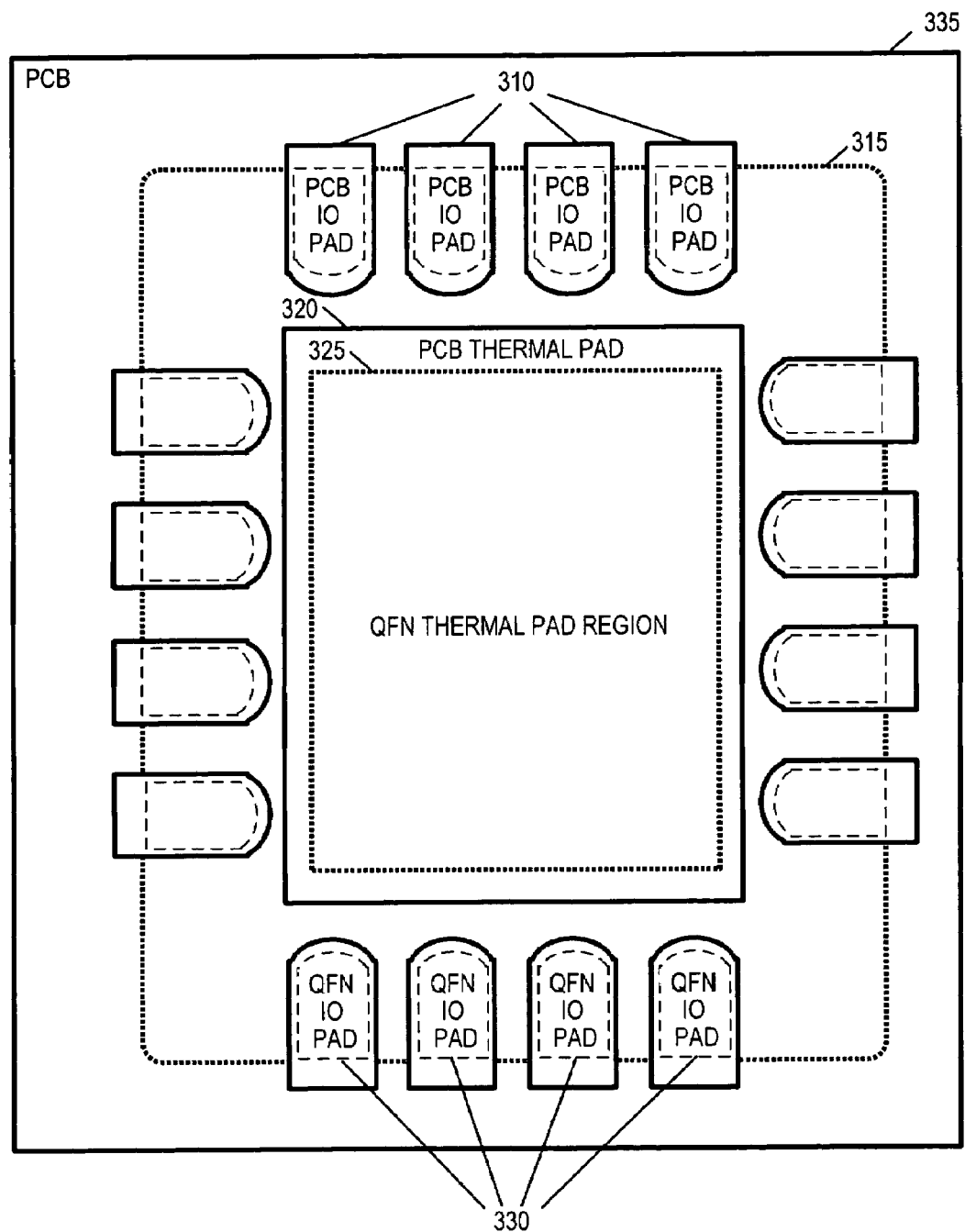
FIG. 3 depicts an overhead view of an embodiment of a system containing a QFN attached to a PCB.

Turning now to FIG. 3, there is shown an overhead view of an embodiment of a portion of a PCBA 300 consisting of an outline of a QFN 315 attached to a portion of a PCB 335. In FIG. 3, dotted figures represent elements of the QFN 315 and solid figures represent elements of the PCB 335. The QFN 315 contains a row of IO pads 330 on each of its four sides. The QFN 315 also contains a thermal pad 325.

To prepare for attachment of the QFN 315, the PCB 335 may be manufactured with IO pads 310 to rest under the IO pads 330 of the QFN 315 and a thermal pad 320 to rest under the thermal pad 325 of the QFN 315. These QFN and PCB pads may be formed from copper or other metals. When the QFN 315 is attached to the PCB 335, the QFN pads rest over the corresponding PCB pads, and are soldered to them. In the embodiment of FIG. 3, the PCB thermal pad 320 is slightly larger than the QFN thermal pad 325, and the PCB IO pads 310 are slightly larger than the QFN IO pads 330 to provide tolerance for imperfect placement. The solder may provide an electrical connection between the QFN IO pads 330 and the PCB IO pads 310. The solder may provide for the transfer of heat between the QFN thermal pad 325 and the PCB thermal pad 320 and may provide a ground or power connection. The solder also may provide a mechanical connection between the QFN 315 and the PCB 335. In the embodiment of FIG. 3, a total area for the deposit of solder upon the PCB thermal pad 320 is determined by determining a total area for the QFN IO pads 310. The total area of the QFN IO, pads 310 is determined from a specification of the geometry of the QFN IO pads 310. The specification may consist of the footprint of the QFN 315, which includes the footprint of the QFN IO pads 310. A total area of the QFN IO pads 310 may be determined from the footprint by measuring, by estimating, by calculating, or by approximating. In another embodiment of the invention, the specification may state a total area for the QFN IO pads 310, and this total area may be read from the specification. In another embodiment, the specification may contain numerical values describing the dimensions of the QFN IO pads 310, and a total area may be calculated, estimated, or approximated based upon the numerical values. A total area for the deposit of solder upon the PCB thermal pad 320 may be determined from the total area of the QFN IO pads 310 by selecting a percentage between 50% and 100% and multiplying the total area of the QFN IO pads 310 by the percentage. For example, selecting a percentage of 100% determines a total area for the deposit of solder upon the PCB thermal pad 320 equal to the total area of the QFN IO pads 310. If the determined area of solder cannot be achieved because of the amount of space occupied by vias or for other reasons, then solder may be applied with the largest area allowable by the relative geometries. As another example, a percentage of 80% may be selected, and a total area for the deposit of solder determined to be 80% of the total area of the QFN IO pads 310. As another example, a percentage of 50% may be selected, and a total area for the deposit of solder determined to be 50% of the total area of the QFN IO pads 310. The solder may not completely cover the PCB thermal pad 320. The solder may achieve less than 50% coverage or even less, such as less than 40% coverage. In other words, the total area for the deposit of solder may be less than 50%, or less than 40%, of a total area of the PCB thermal pad 320.

Figure 4:
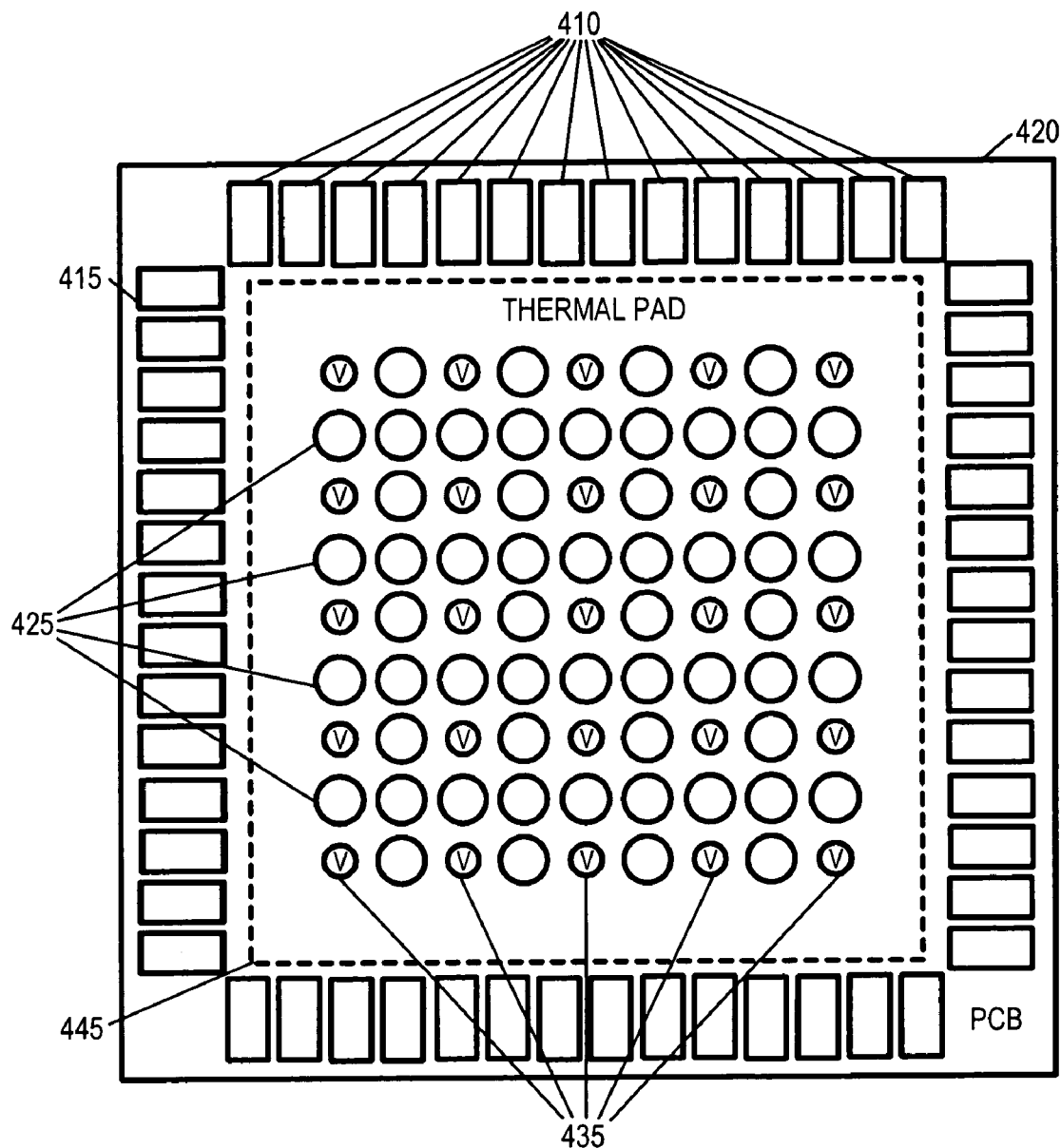
FIG. 4 depicts an embodiment of a footprint of a portion of a PCB to which a QFN is attached.

FIG. 4 illustrates an embodiment of a footprint 400 of a portion of a PCB 420 to which a QFN may be attached. The footprint contains IO pads such as the IO pads 410 and 415 and a thermal pad 445 (indicated by the dotted lines). Vias such as vias 435 and solder regions or pads such as solder pads 425 are located on the thermal pad 445. The IO pads are represented in FIG. 4 by rows of rectangles along the edges of the portion of the PCB 420, the vias are represented by small circles containing the letter "v", and the solder pads are represented by circles slightly larger than the circles representing the vias. A via is a conduit which may conduct heat from the surface of a PCB to interior layers of the PCB and to the opposite surface.

The solder pads such as solder pads 425 may be placed upon the portion of a PCB 420 after manufacture of the PCB. The arrangement of solder pads such as solder pads 425 may be based upon the determination of a total area for the solder pads such as solder pads 425. A total area for the solder pads such as solder pads 425 may be determined in dependence upon the determination of a total area of the IO pads of the QFN which may be located on the footprint 400. A total area of the QFN IO pads may be determined by determining the total area of the PCB IO pads such as IO pads 410 and using the total area of the PCB IO pads such as IO pads 410 as an approximation of the total area of the QFN IO pads. In the present embodiment, the PCB IO pads such as IO pads 410 all have the same shape, and a total area may be obtained by calculating a total area for an individual IO pad and multiplying the total area for the individual IO pad by the number of IO pads such as IO pads 410. The IO pads such as IO pads 410 have a rectangular shape, and an area of an individual IO pad may be obtained by determining a width and a length for the individual IO pad and by multiplying the width by the length. Similarly, the area of a rounded rectangle may be determined by forming a circle at the end of the rectangle, and adding half the area of the circle to the area of the straight part of the rectangle to obtain a total area of the rounded rectangle.

Alternatively, an approximate or estimated area for an IO pad may be determined. In other embodiments, the area of an IO pad with rounded corners or rounded ends may be calculated, for example, by straightening out the figure to form a rectangle and estimating the area of the rectangle. In some embodiments, the various IO pads may have different shapes. In such embodiments, a total area of the IO pads may be determined by determining an area for each individual IO pad and adding up the individual areas to obtain a total area.

An area for the solder pads such as solder pads 425 may be determined from the total area of the QFN IO pads by selecting a percentage and multiplying the calculated total area of the QFN IO pads by the selected percentage. In the embodiment of FIG. 4, the calculated total area of the IO pads is multiplied by 100% to obtain a tentative area for the solder pads. The arrangement of solder pads in this embodiment has a total area approximately equal to the total area of the IO pads. Equalizing the area of the solder pads and the calculated area of the IO pads may produce an equal buoyancy of solder across the connection of the PCB 420 and the QFN. The equal buoyancy may, in turn, lead to a better connection and reduce shorts, opens, and the skewing of the QFN. In many embodiments, a percentage between 50% and 100% may be selected. For example, an area for the solder pads such as solder pads 425 may be determined to be 50% of the area of the QFN IO pads, or 80% of the area of the QFN IO pads, or 100% of the area of the QFN IO pads.

In other embodiments, a total area for solder pads may be calculated by calculating a total area for the IO pads and calculating a total volume of solder on the IO pads in dependence upon the total area of the IO pads. A total volume for the solder pads may be determined in dependence upon the total volume of the IO pads. Finally, a total area for the solder pads may be determined in dependence upon the total volume of the solder pads. For example, the total volume may be divided by the average expected thickness of the solder placed in the thermal region of the PCB.

After determining a total area for the solder pads such as solder pads 425, an arrangement of solder pads such as solder pads 425 can be attempted with the determined total area. If the total area for the arrangement of solder pads such as solder pads 425 is approximately equal to the determined total area, that arrangement of solder pads may be adopted. Similarly, if the total area for the arrangement of solder pads such as solder pads 425 is less than the determined total area but it is difficult to form an arrangement of solder pads with greater area, that arrangement of solder pads may be adopted. Otherwise, another arrangement of solder pads can be formed. In the present embodiment, the solder pads have a circular shape, all of the solder pads have identical shapes, the solder pads are arranged in uniform rows, some of the rows of solder pads contain vias, and all of the vias appear within solder rows. In other embodiments, the solder pads may have non-circular shapes, the solder pads may not all have an identical shape, the solder pads may not be organized in uniform rows, and some of the vias may not appear within solder rows.

A design for an arrangement of solder pads with the desired total area may consider the separation of the solder pads from other elements of the footprint and the sizes of the individual solder pads. The design for the arrangement of solder pads may attempt to maintain a minimum separation between solder pads and IO pads and a minimum separation between solder pads and vias. In addition, the design for the arrangement of solder pads may attempt to maintain a certain minimum individual size of solder pads. If the solder pads are applied to the thermal area by extrusion through a stencil, the design may provide, for example, that the dimensions of the solder pads are greater than the width of the stencil. It can be difficult to correctly form solder shapes of smaller dimension by extrusion through a stencil. The solder pads will not extrude correctly. In addition, the design for the arrangement of solder pads may attempt to maintain a certain maximum size for the solder pads. Large sizes of solder pads may increase the danger of voiding, of a gas bubble forming under the solder and preventing the solder from adhering to the surface. If a gas bubble forms underneath a large size solder pad, it may be difficult for the gas bubble to travel to the side of the solder pad and escape from underneath it. In contrast, a gas bubble forming under a smaller solder pad may more easily travel to the side of the solder pad during the process of heating the solder and escape from underneath the solder pad. In the embodiment of FIG. 4, each via is separated from a solder pad by at least the diameter of the via. Each IO pad is separated from a solder pad by several multiples of the diameter of the solder pad. In other embodiments, the separation between solder pads and vias and the separation between solder pads and IO pads may be larger or smaller than the separation in FIG. 4.

Figure 5:
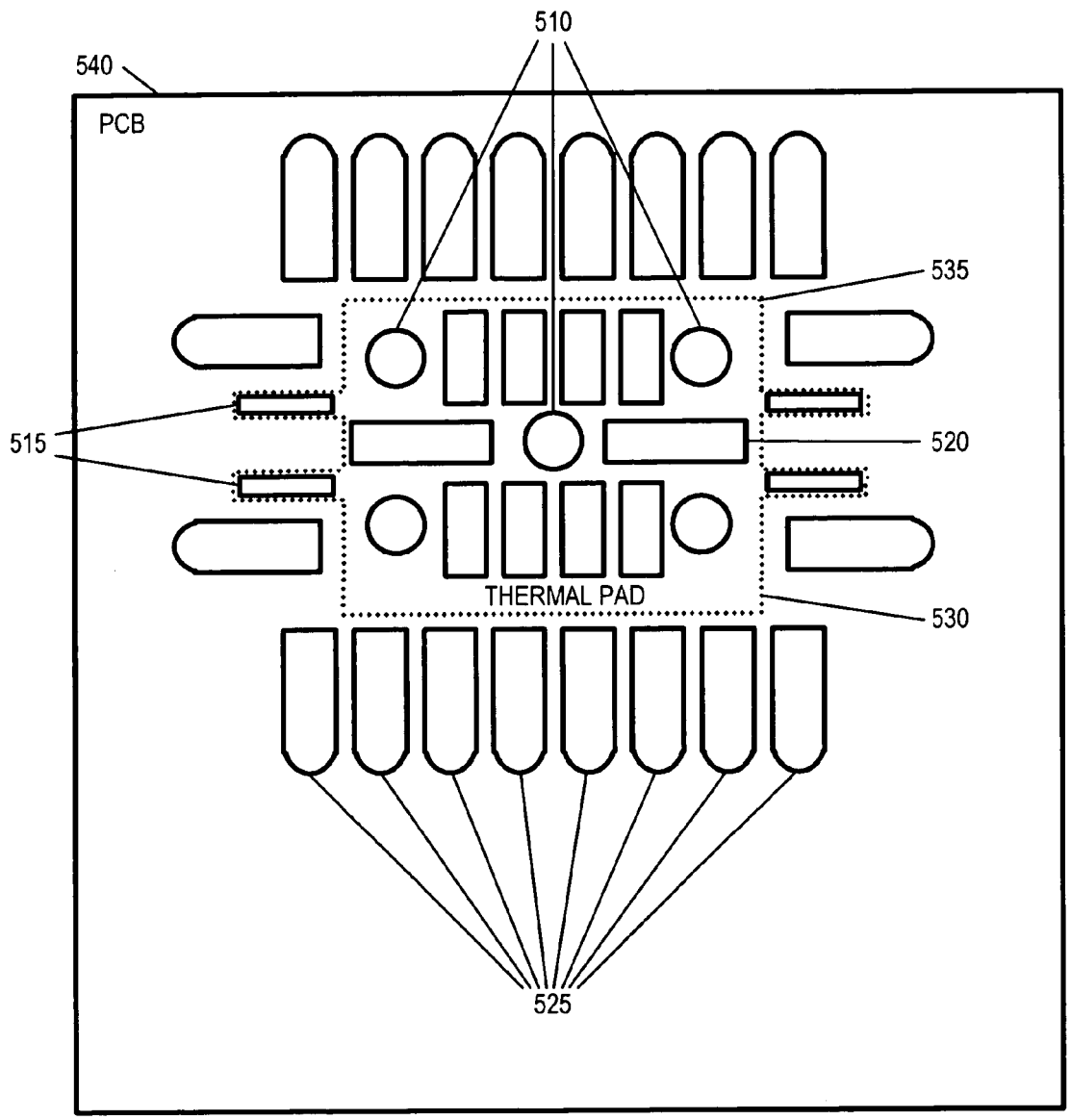
FIG. 5 depicts another embodiment of a footprint of a portion of a PCB to which a QFN is attached.
Figure 5:
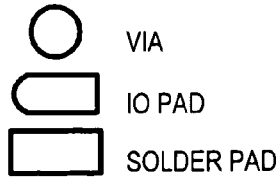

FIG. 5 illustrates another embodiment of a footprint 500 of a portion of a PCB to which a QFN is attached. The footprint contains IO pads such as the IO pads 525 and a thermal pad 535 (indicated by the dotted lines) located on the PCB. Vias such as the vias 510 and solder pads such as solder pads 515, 520, 530 are located on the area of the thermal pad 535. In FIG. 5, the solder pads are represented by rectangles of various sizes, the vias are represented by circles, and the IO pads are represented by rectangles with a rounded end. In the present embodiment, a total area of the IO pads such as IO pads 525 may be calculated based upon an area of an individual IO pad. An area for an individual IO pad may be calculated from the actual shape of the individual IO pad. Alternatively, for ease of calculation, the area of an individual IO pad may be calculated from the shape of a rectangle of the same approximate size.

In the embodiment of FIG. 5, a tentative total area for the solder pads such as solder pads 515, 520, and 530 may be calculated by multiplying the total area of the IO pads such as IO pads 515 by 100%. An arrangement of solder pads such as solder pads 515, 520, 530 in FIG. 5 may then be created and a total area of the solder pads may be calculated. The total area is approximately 50% of the calculated total area of the IO pads. The footprint 500 of FIG. 5 may be accepted as an appropriate layout for the solder pads, however, because it may be difficult to modify the placement of solder pads in footprint 500 to increase the total area of the solder pads. In other embodiments, a tentative total area for the solder pads may be calculated by multiplying the calculated total area of the IO pads by a percentage other than 100%. In other embodiments, an area for the solder pads may be calculated in dependence upon a calculated total area for the IO pads by a different method than multiplying the calculated total area for the IO pads by a percentage.

In the embodiment of FIG. 5, the solder pads have several different sizes. The solder pads form three groups, the group of solder pads such as solder pads 515, the group of solder pads such as solder pads 520, and the group of solder pads such as solder pads 530, with the three groups having different sizes. In the embodiment of FIG. 5, not all of the rows of solder pads contain vias. The vertical row formed by the two solder pads 515 does not contain a via. The minimum separation of solder pads and vias and the minimum separation of solder pads and IO pads are smaller in FIG. 5 than the minimum separations in FIG. 4. In the embodiment of FIG. 5, the thermal pad region 535 is not bounded by the inner edges of the rows of IO pads. Instead, the two solder pads 515 lie to the left of the inner edge of the row of IO pads on the left. Unlike in the footprint of FIG. 4, the thermal pad region 535 of FIG. 5 does not form a rectangle.

Figure 6:
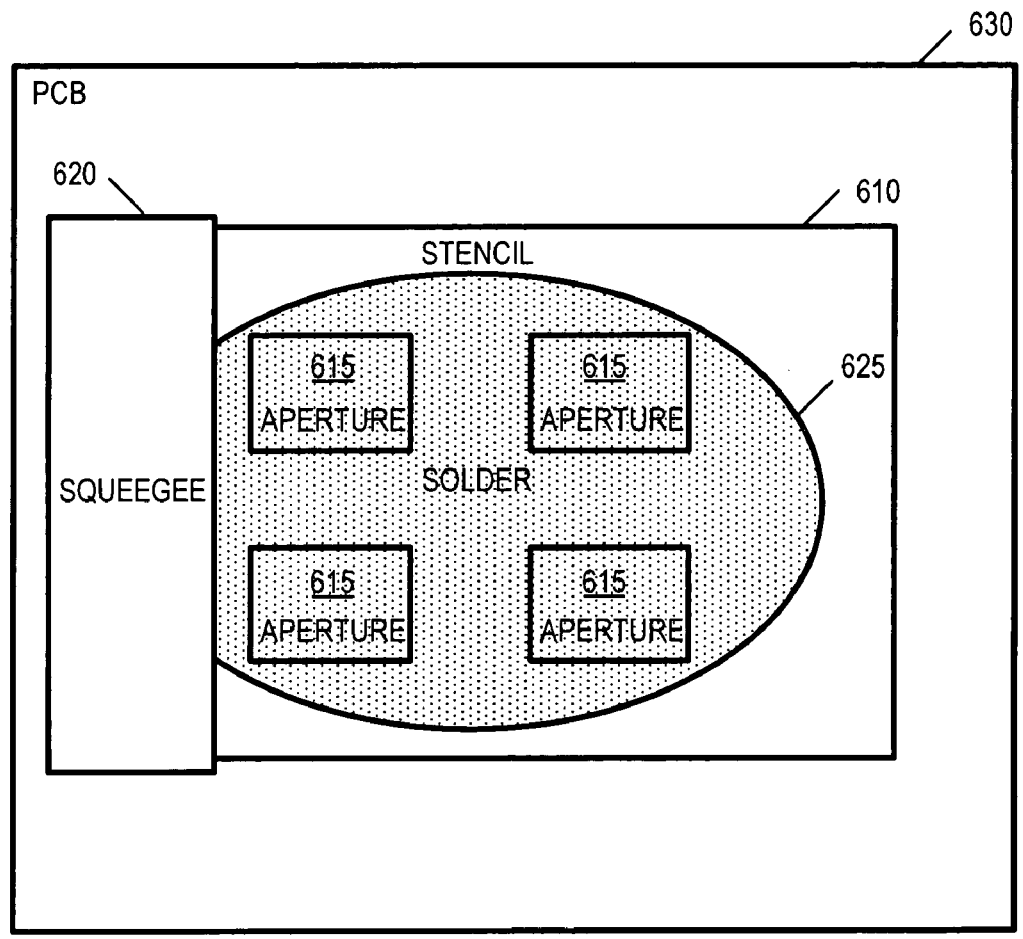
FIG. 6 depicts an apparatus for controlling the deposit of solder onto a thermal pad of a PCB for the attachment of a QFN.

Turning now to FIG. 6, there is shown an overhead view of a system 600 for applying solder to a portion of a PCB which includes a portion of a PCB 630, a stencil 610, solder 625, and a squeegee 620. The stencil 610 is a thin metal sheet with holes cut through (apertures 615) to allow solder 625 to be deposited on the portion of the PCB 630. The solder 625 consists of a paste. The stencil 610 may be 0.003" to 0.006" thick. The stencil 610 may be made of brass or stainless steel or other metals. The apertures 615 may be trapezoidal to allow a uniform release of the solder paste 625 onto the portion of the PCB 630 and to reduce the smearing of solder paste. The stencil 610 may be laser-cut and the aperture walls may be electro polished for smoothing. Solder 625 may be applied to the top of the stencil 610. The squeegee 620 may be composed of metal or plastic. The length of the squeegee 620 may be greater than or equal to the width of the stencil 610 to allow extrusion of the solder paste 625 through the apertures 615 in the stencil 610 with a single pass of the squeegee 620 over the stencil 610. The body of the stencil 610 may shield the portion of the PCB 630 from the deposit of solder 620 other than in the areas beneath the apertures 615.

In alternative embodiments, other systems may be used to apply solder to a PCB. For example, a solder mask may be placed over the PCB and solder applied to the PCB. The solder does not deposit on the regions of the PCB shielded by the solder mask.

Figure 7:
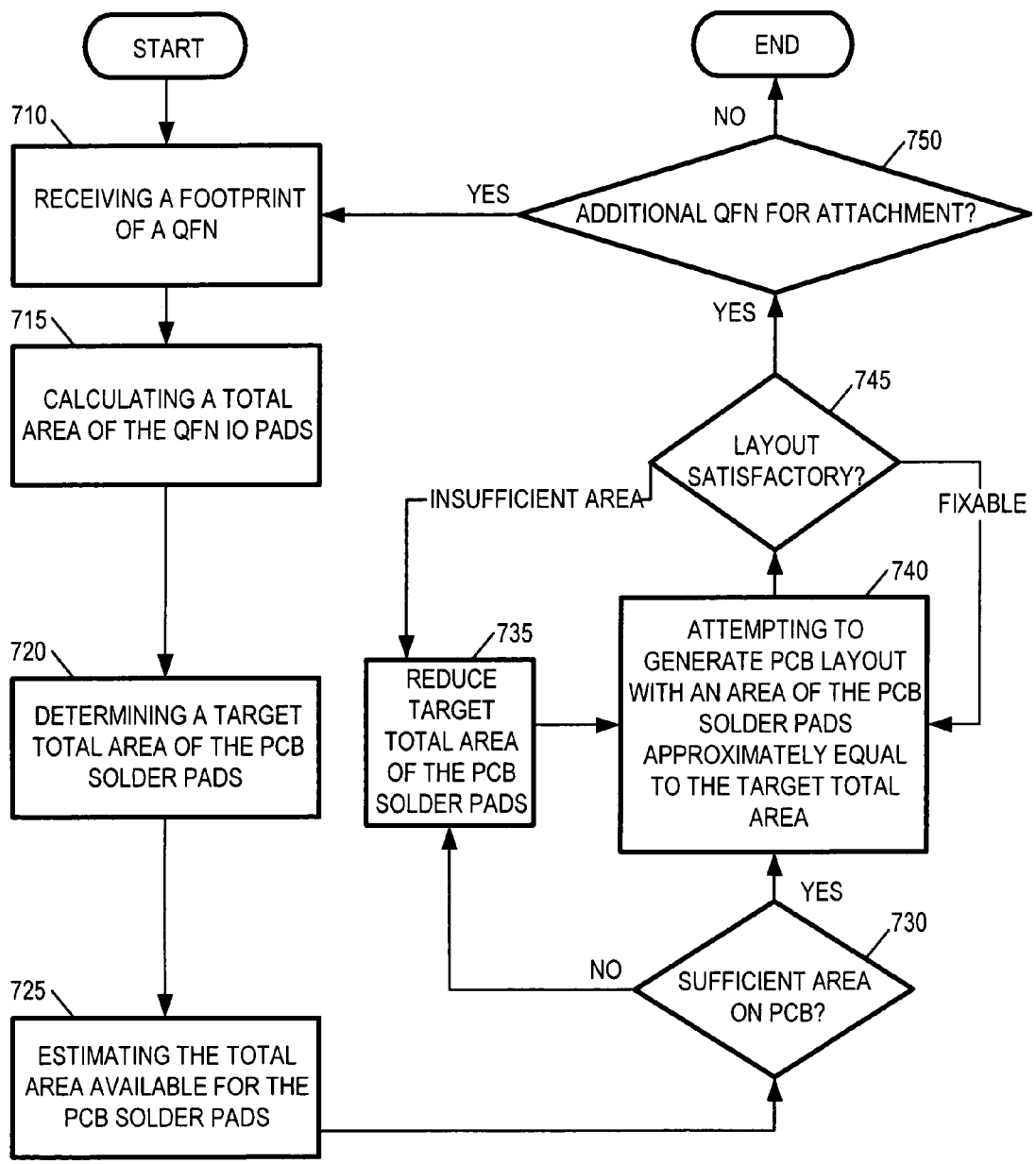
FIG. 7 depicts a flowchart of an embodiment of a method to attach a QFN to a PCB.

Referring now to FIG. 7, there is shown a flowchart of an embodiment to generate an arrangement of solder pads in a PCB thermal pad for the attachment of a QFN. Flow chart 700 begins with receiving a footprint of a QFN (element 710). The footprint is a diagram of the projection of the QFN onto the surface of the PCB and indicates the shapes and placement of the QFN IO pads and the QFN thermal pad. A total area of the QFN IO pads may be calculated (element 715). The total area may be calculated to a more or less close approximation of the actual total area of the QFN IO pads. A target total area of PCB solder pads to be located on the PCB thermal pad may next be determined (element 720). The target area for the solder pads may be calculated by selecting a percentage and multiplying the calculated total area of the IO pads by the selected percentage. For example, a percentage of 80% may be selected in an attempt to equalize the buoyancy of solder across the connection between the PCB and the QFN. The total area available for the solder pads in the PCB thermal pad region may then estimated (element 725). The estimate may include determining a size for the PCB thermal pad region. For example, the estimate may be a percentage of the total area of the PCB thermal pad region. As another example, the estimate made by performed by inserting locations for vias in the PCB thermal pad region, drawing boundaries around them to separate them from solder pads, and estimating the area of solder pads that could be placed in the remaining area. As another example, a rough layout of the PCB thermal pad region could be created, which includes both vias and solder pads. The total area of the solder pads in the layout could be measured or estimated.

Next, the estimate of total area available for solder pads on the PCB thermal pad region may be compared with the target total area (element 730). If the estimated available total area for solder pads is too small to meet the target goal, the target goal may be reduced (element 735). If the estimated available total area for solder pads is sufficient to meet the target goal, a layout for the PCB thermal pad region may be generated which attempts to meet the target total area for the solder pads (element 740). The layout may include the size of the PCB thermal pad region; the size, shape, and location of any vias to be located in the PCB thermal pad region; and the size, shape and location of the solder pads. The layout may then be examined (element 745). If the layout is satisfactory and there are additional QFNs for attachment to the PCB (element 750), each element of flowchart 700 from element 710 to element 745 may be repeated. If the layout is satisfactory, but there are no additional QFNs for attachment, the generation of an arrangement of solder pads in a PCB thermal pad to attach a QFN may end.

If, after checking the layout at element 745, it is determined that there is not sufficient area in the PCB thermal pad region to meet the target total area of the solder pads, then the target total area may be reduced (element 735) and another attempt to generate a satisfactory layout made (element 740). If the layout is unsatisfactory for some other reason, then another attempt to generate a satisfactory layout with the same target goal may be made (element 740). For example, the total area of the solder pad regions may be significantly greater than the target total area of the solder pads. A layout with a reduced total area of the solder pad regions may then be created. As another example, there may not be adequate separation between the solder pads and the vias.

In the embodiment of FIG. 7, regions for solder pads were inserted in a PCB land pattern. In other embodiments, only a total area for the regions is determined, and not the actual regions themselves. For example, a QFN manufacturer may recommend to a PCBA assembler a total area for the solder pad regions in the thermal pad of the PCB which is connected to the QFN. The QFN manufacturer may not discuss specific layouts. Further, in the embodiment of FIG. 7, a total area for the PCB solder pads was determined from a total area of the QFN IO pads by multiplying the total area of the QFN IO pads by a percentage. In other embodiments, a different procedure may be used to determine a total area of the solder pads in dependence upon the area of the QFN IO pads.

Another embodiment of the invention is implemented as a program product for generating an arrangement of solder pads such as the method of generation 700 illustrated in FIG. 7. The program(s) of the program product defines functions of the embodiments (including the methods described herein) and can be contained on a variety of data and/or signal-bearing media. Illustrative data and/or signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet and other networks. Such data and/or signal-bearing media, when carrying computer-readable instructions that direct the functions of the present invention, represent embodiments of the present invention.

In general, the routines executed to implement the embodiments of the invention may be part of an operating system or a specific application, component, program, module, object, or sequence of instructions. The computer program of the present invention typically is comprised of a multitude of instructions that will be translated by a computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

It will be apparent to those skilled in the art having the benefit of this disclosure that the present invention contemplates methods and arrangements to generate an arrangement of solder pads for the attachment of a QFN to a PCB, and that the present invention contemplates systems which include a QFN attached to a PCB. It is understood that the form of the invention shown and described in the detailed description and the drawings are to be taken merely as examples. It is intended that the following claims be interpreted broadly to embrace all the variations of the example embodiments disclosed.

Although the present invention and some of its advantages have been described in detail for some embodiments, it should be understood that various changes, substitutions and alterations can be made herein without departing from the spirit and scope of the invention as defined by the appended claims. Although an embodiment of the invention may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A printed circuit board assembly (PCBA), the PCBA comprising:
    a printed circuit board (PCB) comprising a thermal pad and input-output (IO) pads, wherein the thermal pad contains a plurality of vias;
    a quad pack flat no-lead chip (QFN) soldered to the printed circuit board, the QFN comprising a thermal pad and IO pads; and
    regions of solder coupling the pads of the printed circuit board with the pads of the QFN, wherein a total area of the regions of solder coupling the thermal pad of the QFN and the thermal pad of the PCB (thermal pad solder regions) is between 50% and 120% of a total area of the IO pads for the PCB and the total area of the regions of solder for the thermal pad is less than 50% of an area of the PCB thermal pad; wherein:
    the thermal pad solder regions possess a plurality of different shapes based upon a design, the thermal pad solder regions constituting rectangular thermal pad solder regions possessing a plurality of different sizes and orientations; and
    each region of solder is separated from each via by at least the diameter of the via.

2. The PCBA of claim 1, wherein the total area of the thermal pad solder regions is less than 40% of the area of the PCB thermal pad.

3. The PCBA of claim 1, wherein the total area of the thermal pad solder regions is determined based upon a selected percentage of the total area of the IO pads of the printed circuit board.

4. The PCBA of claim 1, wherein the regions of solder coupling the pads of the printed circuit board with the pads of the QFN comprise regions of solder with a minimum diameter of 0.010 inches.

5. The PCBA of claim 1, wherein the thermal pad, the IO pads and the thermal pad solder regions comprise the thermal pad having a center, an IO pad, and a thermal pad solder region wherein:
    an edge of the thermal pad solder region is farther from the center of the thermal pad than an edge of the IO pad; and
    the thermal pad has a non-rectangular shape.

6. The PCBA of claim 5, wherein:
    the IO pad and another IO pad lie on a row of IO pads to one side of the PCBA; and
    a portion of the thermal pad solder region lies between the IO pad and the other IO pad on the row of IO pads to the one side of the PCBA.

7. An apparatus for controlling the deposit of solder onto a thermal pad of a printed circuit board (PCB) for the attachment of a quad pack flat no-lead chip (QFN) to the PCB, the QFN comprising a thermal pad and input-output pads (IO pads), wherein:
    the apparatus is configured to provide a shield against the deposit of solder on a portion of the thermal pad of the PCB; and
    the apparatus is configured to enable the deposit of regions of solder onto the thermal pad of the PCB with a total area of the regions of solder between 50% and 120% of a total area of the input-output pads of the QFN, and with the total area of the regions of solder less than 50% of the area of the thermal pad of the PCB, wherein the enabling comprises enabling the deposit of the regions of solder possessing a plurality of different shapes based upon a design, the regions constituting:
    rectangular thermal pad solder regions possessing a plurality of different sizes and orientations; and wherein each region of solder is separated from each via by at least the diameter of the via.

8. The apparatus of claim 7, wherein the apparatus comprises a solder mask.

9. The apparatus of claim 7, wherein the apparatus comprises a stencil.

10. The apparatus of claim 7, wherein the apparatus is configured to enable the deposit of regions of solder onto the thermal pad of the PCB with a total area of the regions of solder deposited onto the thermal pad of the PCB less than 40% of the area of the thermal pad of the PCB.

11. The apparatus of claim 7, wherein the apparatus is configured to enable the deposit of regions of solder onto the thermal pad of the PCB with a total area of the regions of solder deposited onto the thermal pad of the PCB based upon a selected percentage of the total area of the IO pads of the QFN.

12. The apparatus of claim 7, wherein the apparatus is configured to enable the deposit of regions of solder onto the thermal pad of the PCB with a minimum diameter of 0.010 inches.

13. A method of attaching a quad pack flat no-lead chip (QFN) to a printed circuit board, the method comprising:
    receiving a specification of the geometry of the input-output (IO) pads of the QFN;
    determining a total area for the IO pads of the QFN based upon the specification;
    determining a total area for a deposit of solder upon the thermal pad of the printed circuit board, wherein the total area for the deposit of solder upon the thermal pad of the printed circuit board is between 50% and 120% of a total area of the IO pads for the PCB and the total area of the deposit of solder for the thermal pad is less than 50% of an area of the PCB thermal pad;
    determining a placement of vias on the thermal pad;
    determining a number of regions of the deposit of solder; and
    determining shapes of the regions of the deposit of solder, wherein:
    a total area of the shapes of the regions of the deposit of solder is the total area determined for the deposit of solder; wherein the regions of solder coupling the thermal pad of the QFN and the thermal pad of the PCB (thermal pad solder regions) constitute rectangular thermal pad solder regions possessing a plurality of different sizes and orientations; and
    each region of the deposit of solder is separated from each via by at least the diameter of the via.

14. The method of claim 13, wherein determining a total area for a deposit of solder upon the thermal pad of the printed circuit board comprises determining a total area for a deposit of solder upon the thermal pad of the printed circuit board wherein the total area of the deposit of solder upon the thermal pad of the printed circuit board is less than 40% of the area of the PCB thermal pad.

15. The method of claim 13, further comprising depositing solder upon the thermal pad of the printed circuit board based upon determining a total area for the deposit of solder upon the upon the thermal pad of the printed circuit board, determining a number of regions of the deposit of solder; and determining shapes of the regions of the deposit of solder.

* * * * *